(12) United States Patent
Garudadri et al.

(10) Patent No.: US 7,643,558 B2
(45) Date of Patent: Jan. 5, 2010

(54) METHOD, APPARATUS, AND SYSTEM FOR ENCODING AND DECODING SIDE INFORMATION FOR MULTIMEDIA TRANSMISSION

(75) Inventors: Harinath Garudadri, San Diego, CA (US); Kannan Ramchandran, El Cerrito, CA (US)

(73) Assignee: QUALCOMM Incorporated, San Diego, CA (US)

( * ) Notice: Subject to any disclaimer, the term of this patent is extended or adjusted under 35 U.S.C. 154(b) by 625 days.

(21) Appl. No.: 10/396,982

(22) Filed: Mar. 24, 2003

(65) Prior Publication Data

US 2004/0194008 A1 Sep. 30, 2004

(51) Int. Cl.
*H04N 7/18* (2006.01)
(52) U.S. Cl. .............. 375/240.23; 375/240.25; 375/240.26
(58) Field of Classification Search .................. 375/240.01–240.29
See application file for complete search history.

(56) References Cited

U.S. PATENT DOCUMENTS

| | | | | |
|---|---|---|---|---|
| 4,191,970 A | * | 3/1980 | Witsenhausen et al. | .. 348/420.1 |
| 6,353,629 B1 | * | 3/2002 | Pal | ............ 375/222 |
| 6,564,658 B2 | | 5/2003 | Pchelnikov et al. | |
| 6,577,682 B1 | * | 6/2003 | Brightwell et al. | ..... 375/240.24 |
| 6,674,802 B2 | * | 1/2004 | Knee et al. | ............ 375/240.26 |
| 6,888,888 B1 | * | 5/2005 | Tu et al. | ............ 375/240.01 |
| 7,012,962 B1 | * | 3/2006 | Cho et al. | ............ 375/240.26 |

FOREIGN PATENT DOCUMENTS

| | | |
|---|---|---|
| CN | 1224299 | 7/1999 |
| WO | 9841028 | 9/1998 |

OTHER PUBLICATIONS

Sankur B. et al., "Two-Layer Coding for Videotelephone." Signal Processing. Image Communication, Elsevier Science Publishers, Amsterdam, NL. vol. 5, No. 4, Oct. 1, 1993, pp. 295-296.

Kondi L.P. et al., "On video SNR scalability." Image Processing, 1998. ICIP 98. Proceedings. 1998 International Conference on Chicago, IL., Oct. 4, 1998, pp. 934-938.

Lee B.R. et al., "H.263-Based SNR Scalable Video Codec." IEEE Transactions on Consumer Electronics, IEEE Inc. New York, vol. 43, No. 3, Aug. 1, 1997, pp. 614-622.

(Continued)

*Primary Examiner*—Andy S Rao
(74) *Attorney, Agent, or Firm*—Thien T. Nguyen; Steven R. Thiel

(57) ABSTRACT

According to one aspect of the present invention, a method and apparatus is provided in which input data (e.g., input video data) is encoded in accordance with a first coding standard (e.g., MPEG-4) to generate encoded data. The input data is also encoded based on a reconstruction of the input data to generate encoded side information associated with the input data. The encoded data are transmitted to a destination (e.g., a decoding subsystem) over a first channel and the encoded side information are transmitted to the destination over a second channel. The encoded data and the encoded side information are decoded and combined at the destination to generate output data.

42 Claims, 7 Drawing Sheets

OTHER PUBLICATIONS

Abousleman G.P. Ed—Cohen C.J., "Channel-optimized video coding for low-power wireless applications" Applied Imagery Pattern Recognition Workshop, AIPR 2001 30th Washington, DC, Oct. 10, 2001, pp. 163-168.

Vetro A. et al., "True Motion Vectors for Robust Video Transmission" Jan. 1999, Proceedings of the Spie, Spie, Bellingham, VA. pp. 230-240.

Aaron A. et al. Institute of Electrical and Electronics Engineers: "Wyner-ziv coding of motion video." Nov. 3, 2002, Information Systems Laboratory, Department of Electrical Engineering Stanford University. pp. 240-244.

Pradhan, S. Sandeep et al. (1999) Distributed source coding using syndromes (DISCUS): design and construction. IEEE pp. 1-10.

S. S. Pradhan and K. Ramchandran, "Distributed Source Coding Using Syndromes (DISCUS): Design and Construction," *IEEE Data Compression Conference*, pp. 1-10, Mar. 1999.

International Search Report-PCT/US04/008950, International Search Authority -European-Patent-Office—Apr. 22, 2005.

International Preliminary Report on Patentability—PCT/US04/08950, International Search Authority—IPEA/US—Alexandria, Virginia—Feb. 13, 2009.

Written Opinion -PCT/US04/008950, International Search Authority -European-Patent-Office—Arp. 22, 2005.

\* cited by examiner

METHOD, APPARATUS, AND SYSTEM FOR ENCODING AND DECODING SIDE INFORMATION FOR MULTIMEDIA TRANSMISSION

FIELD

The present invention relates generally to the fields of data processing and data communication, and more particularly to a method, apparatus, and system for encoding and decoding side information for multimedia transmission.

BACKGROUND

As technology continues to advance and the demand for video and audio signal processing continues to increase at a rapid rate, effective and efficient techniques for signal processing and data transmission have become more and more important in system design and implementation. Various standards or specifications for multimedia processing and transmission including video signal processing have been developed over the years to standardize and facilitate various coding schemes relating to multimedia signal processing. In particular, a group known as the Moving Pictures Expert Group (MPEG) was established to develop a standard or specification for the coded representation of moving pictures and associated audio stored on digital storage media. As a result, a standard known as the ISO/IEC 14496-2 (Part 2—Visual) CODING OF AUDIO-VISUAL OBJECTS (also referred to as the MPEG-4 standard or MPEG-4 specification herein), published December, 1999, was developed which standardizes various coding schemes for visual objects or video signals. ISO stands for International Organization for Standardization and IEC stands for International Electrotechnical Commission, respectively. Generally, the MPEG specification does not standardize the encoder but rather the type of information that an encoder needs to produce and write to an MPEG compliant bitstream, as well as the way in which the decoder needs to parse, decompress, and resynthesize this information to regain the encoded signals.[Q1] Other coding standards include, for example, ITU-T Recommendation H.263 "Video Coding for Low Bitrate Communication", H.264, etc.

A typical video processing system 100 is illustrated in FIG. 1 which includes a video encoder 110 and a video decoder 130. In this configuration, the video encoder 110 and the video decoder 130 may operate in accordance with an established standard or specification. For example, the video encoder 110 and the video decoder 130 may operate in accordance with the MPEG-4 standard. Thus, the video encoder 110 may be referred to as MPEG-4 encoder and the video decoder 130 may be referred to as MPEG-4 decoder, respectively. In the system configuration illustrated in FIG. 1, at the transmitting end, the video encoder 110 receives video input data and encodes the video input data to generate or produce encoded video data that are transmitted to the video decoder 130 via a channel 120. The channel 120 can be a wireless or wired channel and is also referred to as the main channel or main stream herein. At the receiving end, the video decoder 130 receives the encoded video data, decodes the encoded video data to generate or produce video output data. During the transmission process over the channel 120, errors may be introduced due to various factors including noise, signal interference, fading, loss of connection, etc. Such errors will negatively impact the performance of the video decoder 130 and thus the quality of the video output data is degraded. Various conventional error coding techniques such as error detection coding, forward error correction (FEC), or automatic repeat/retransmission request (ARQ) schemes may be used to keep the error rate at an acceptable level. However, such conventional techniques may result in significant inefficiency because of the data redundancy and/or longer latency. Video compression standards also provide additional mechanisms to mitigate the adverse effects of errors introduced by transmission. These are resynchronization markers, data partitioning, reversible variable length coding (RVLC), etc. These error resilience tools increase the complexity of the encoder/decoder and increase the data rate required to transmit video information. Furthermore, these tools may not provide adequate protection against bursty errors typically seen in a spread spectrum communication channel such as a CDMA network.

Accordingly, there exists a need for a method, apparatus, and system for improving the quality of multimedia information such as video data in multimedia processing systems without incurring significant processing inefficiency.

SUMMARY OF THE INVENTION

According to one aspect of the present invention, a method is provided in which input data (e.g., input video data) is encoded in accordance with a first coding standard (e.g., MPEG-4, H.263) to generate encoded data. The input data is also encoded based on a reconstruction of the input data to generate encoded side information associated with the input data. The encoded data are transmitted to a destination (e.g., a decoding subsystem) over a first channel and the encoded side information are transmitted to the destination over a second channel. The encoded data and the encoded side information are decoded and combined at the destination to generate output data.

According to another aspect of the present invention, an apparatus is provided which includes a first encoder and a second encoder. The first encoder receives input data and encodes the input data in accordance with a first coding standard (e.g., MPEG-4) to generate encoded data for transmission over a first channel. The second encoder receives the input data and a reconstruction of the input data from the first encoder and encodes the input data based, at least in part, on the reconstruction of the input data to generate encoded side data for transmission over a second channel.

According to yet another aspect of the invention, an apparatus is provided which includes a first decoder and a second decoder. The first decoder decodes encoded data received on a first channel and the second decoder decodes encoded side data received on a second channel. Data generated from the first encoder and data generated from the second decoder are combined to generate output data.

According to a further aspect of the invention, a system is provided which includes a first encoder, a second encoder, a first decoder, and a second decoder. The first encoder receives input data and encodes the input data in accordance with a first coding standard to generate encoded data for transmission over a first channel. The second encoder receives the input data and a reconstruction of the input data from the first encoder and encodes the input data based, at least in part, on the reconstruction of the input data to generate encoded side data for transmission over a second channel. The first decoder decodes the encoded data received on the first channel and the second decoder decodes encoded side data received on the second channel. Data generated from the first decoder and data generated from the second decoder are combined to generate output data.

According to another aspect of the invention, a machine-readable medium is provided including instructions which, when executed by a machine, cause the machine to perform operations to encode input data in accordance with a first encoding standard to generate encoded data, encode the input data based on a reconstruction of the input data to generate encoded side data, and transmit the encoded data over a first channel and the encoded side data over a second channel to a destination.

BRIEF DESCRIPTION OF THE DRAWINGS

Various aspects and features of the present invention are disclosed by the following detailed description and references to the accompanying drawings, in which.

DETAILED DESCRIPTION

In the following detailed description numerous specific details are set forth. However, it is understood that various embodiments of the invention may be practiced without these specific details. It should be appreciated and understood by one skilled in the art that the various embodiments of the invention described below are exemplary and are intended to be illustrative of the invention rather than limiting.

As described in more details below, according to one embodiment of the invention, a method and system framework is provided for encoding an extra digital stream in addition to a main stream that carries a multimedia bit-stream. The extra digital stream is also referred to as a side channel or hint channel herein. Such an extra digital channel can be used for providing error resiliency to the multimedia bit-stream transmitted over the main channel, thus improving quality of the multimedia information (e.g., video data) that are generated at the receiving end (e.g., the video data generated by a video decoder). In addition, in accordance with one embodiment of the invention described in greater detail below, the amount of hint or side channel information transmitted over the side channel can be adapted or dynamically adjusted based on various factors including channel conditions, the amount of protection the side channel needs to provide, etc.

Figure 2A:
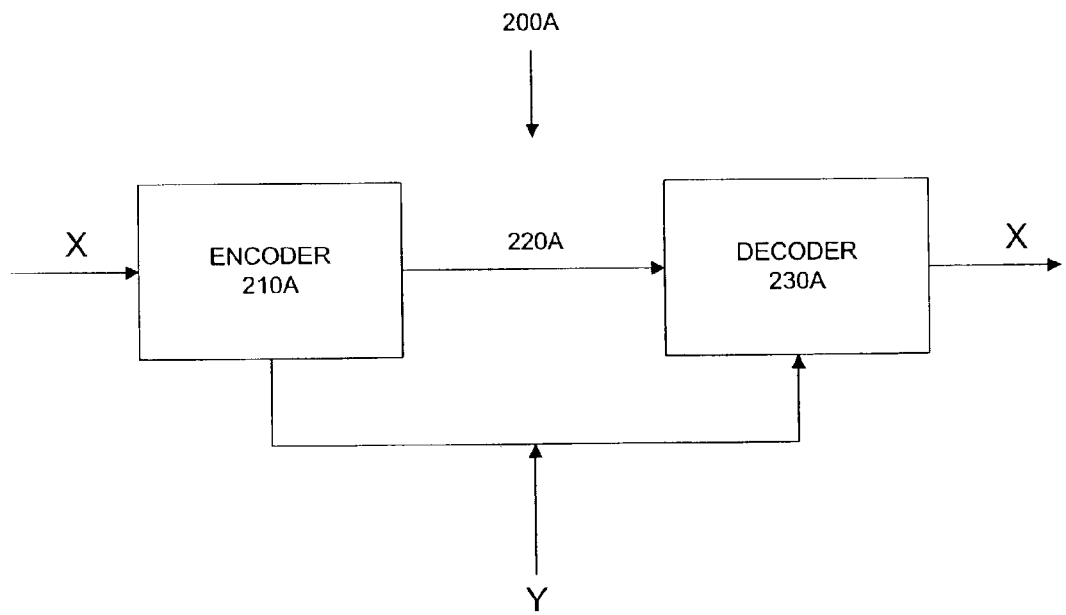
FIG. 2A is a block diagram illustrating a processing system in which both encoder and decoder units have access to side information.
Figure 2B:
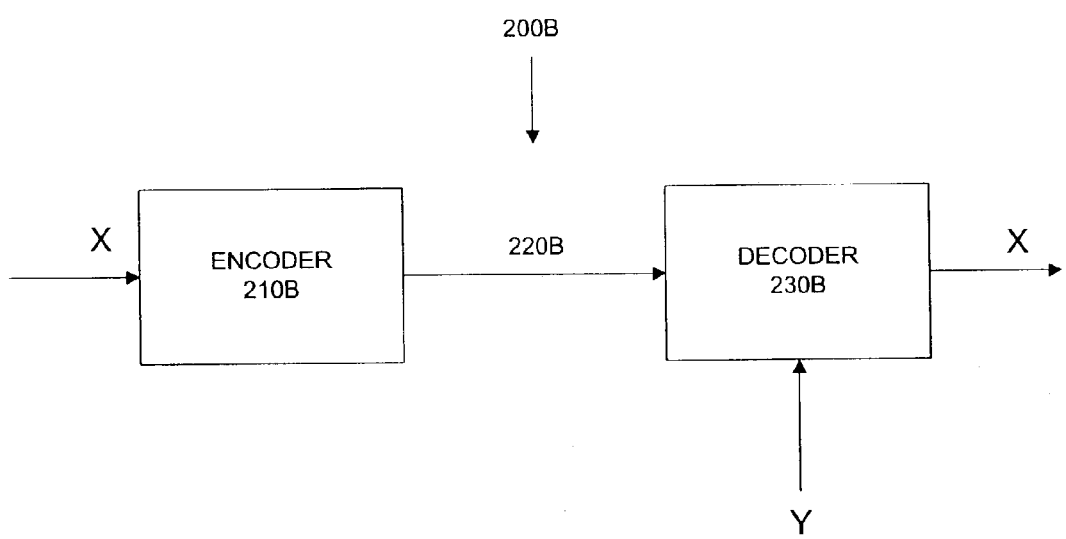
FIG. 2B is a block diagram illustrating a processing system in which only the decoder unit has access to side information.

The discussion which follows provides explanations and illustrations for a method and system framework which employs coding with side information. Coding with side information framework was discussed by S. S. Pradhan and K. Ramchandran in a technical paper entitled "Distributed Source Coding Using Syndromes (DISCUS): Design and Construction", in the Proceedings of the Data Compression Conference (DCC), March 1999. Referring now to FIGS. 2A and 2B, processing systems 200A and 200B are illustrated, respectively. Processing system 200A includes an encoder 210A which transmits data to a decoder 230A over channel 220A. Likewise, processing system 200B includes an encoder 210B which transmit data to a decoder 230B over channel 220B.

As shown in FIGS. 2A and 2B, it is assumed that X and Y are 3-bit long binary data that can equally likely take on each of the 8 possible binary 3-tuples. However, X and Y are correlated random variables. The correlation between them is such that the Hamming distance between X and Y is at most 1. That is, given a value of Y (e.g., Y=[0 1 0]), the value of X is either the same as the value of Y (i.e., X=[0 1 0]) of differs in one bit with respect to the value of Y. For example, the value of X can be off in the first bit (X=[1 1 0]) or off in the middle bit (X=[0 0 0]) or off in the last bit (X=[0 1 1]).

Figure 1:
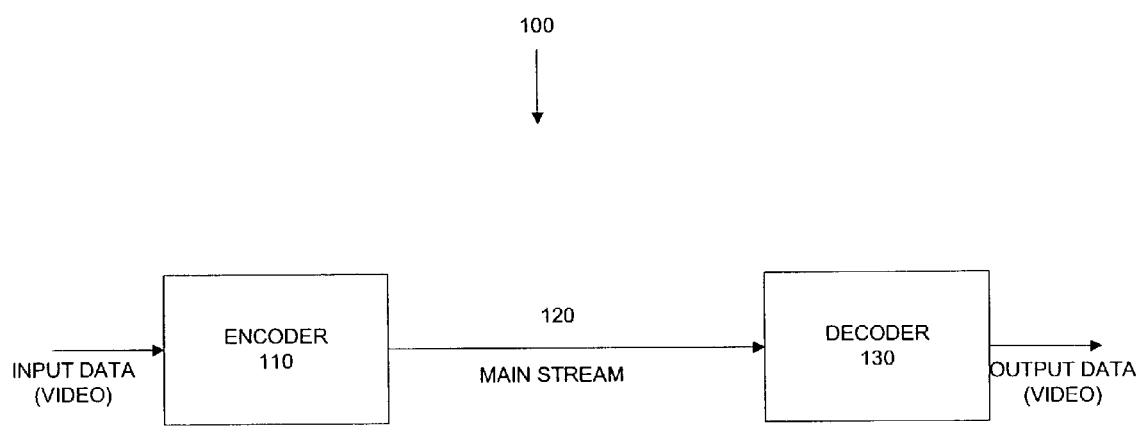
FIG. 1 is a block diagram illustrating a typical video processing system.

The following discussion will show that X can be efficiently encoded in the two scenarios illustrated in FIG. 1 so that X can be correctly reconstructed at the decoder.

Scenario 1: In the first scenario shown in FIG. 2A, Y is present both at the encoder 210A and at the decoder 230A. In this scenario, X can be predicted from Y. The residue ($X \oplus Y$), also called residual data or residual information, or the error pattern of X with respect to Y can take 4 distinct values and hence can be encoded with 2 bits. This can be referred to as the least possible (best) rate needed to encode X. At the receiving end, the decoder can combine the residue with Y to obtain X. In this case, as described in more detail below, X is analogous to the current multimedia coding unit that needs to be transmitted over the hint channel. Y is analogous to the reconstruction for the current multimedia coding unit based on the main channel. This method where the residue is encoded for the hint channel corresponds to predictive coding.

Scenario 2: In the second scenario as shown in FIG. 2B, the encoder for X (encoder 210B) does not have access to Y. The performance of this scenario is thus limited by that of the first scenario. However, the encoder for X does know the correlation structure between X and Y and also knows that the decoder has access to Y. In this seemingly worse scenario, it can be shown below that the same performance can be achieved as in the first scenario. That is, in the second scenario, X can also be encoded with 2 bits.

This can be done using the following approach. In this approach, the space of codewords of X can be partitioned into 4 sets each containing 2 codewords, as follows:

Coset1 containing ([0 0 0] and [1 1 1]);
Coset2 containing ([0 0 1] and [1 1 0]);
Coset3 containing ([0 1 0] and [1 0 1]); and
Coset4 containing ([1 0 0] and [0 1 1]).

In this example, the encoder for X can identify the set containing the codeword for X and can send the index for the respective set instead of the individual codeword. Since there are 4 sets in the space of codewords of X, they can be indexed in 2 bits. The decoder, on the reception of the coset index, can use Y to disambiguate or obtain the correct X from the set by indicating or declaring that the codeword that is closest to Y as the answer. As mentioned above, it should be noted that the distance between X and Y is at most 1, and the distance between the 2 codewords in any set is 3. Hence, decoding of X in the second scenario can be done correctly based on the coset index and Y. For example, if Y is [0 0 1] and X is [0 1 1], then encoder 210B, instead of sending the individual codeword for X, sends the index for the corresponding set containing the value of X, which is Coset 4 in this case. Accordingly, the decoder 230B, upon receiving this index from the encoder 210B, calculates the distance between Y ([0 0 1]) and one of the codeword in Coset 4 ([1 0 0]) which equals 2, and between Y ([0 0 1]) and the other codeword ([0 1 1]) which equals 1. Since the decoder 210B knows that the distance between X and Y is at most 1, [0 1 1] is decoded as the observed codeword for X, which the correct value of X in this example. This mode of encoding where the decoder has access to correlated side information is known as side information coding. The performance of a system which employs coding with side information system can match that of one based on predictive coding, as code lengths get large. In general, the correlation between X and Y can help reduce the transmission rate. Based on the previous discussion, the following observations are noted:

- It is noted that that Coset1 is a repetition channel code of distance 3 and the other sets are cosets of this code in the codeword space of X. In this instance, we have used a channel code that is "matched" to the correlation distance (e.g., noise) between X and Y to partition the source codeword space of X. This results in a side information encoding system that gives a high compression performance which is identical or comparable to a predictive coding system.
- In practice, the partitioning of the source codeword space and index labeling of the resulting cosets (index labels for cosets are also called syndromes herein) can be done in a very computationally efficient way through the framework of coset codes. Thus, the encoder in a side information coding system incurs a low encoding complexity.
- It should be noted that the partitioning of X as discussed above is also universal. That is, the same partitioning of X works for all Y regardless of the value of Y as long as both X and Y satisfy the correlation structure. For example, if X is [0 1 0], then the same encoding for X (e.g., index of Coset 3) will be applicable to all cases of Y(e.g., [0 1 0], [1 1 0], [0 0 0] and [0 1 1].) Thus, unlike a predictive coding setup there is no dependency between the encoding for X and the value of the correlated information Y, thus providing universality. Hence, the invention presented here will apply to all predictive coding techniques such as MPEG-4, H.263, H.264, etc.

Figure 3:
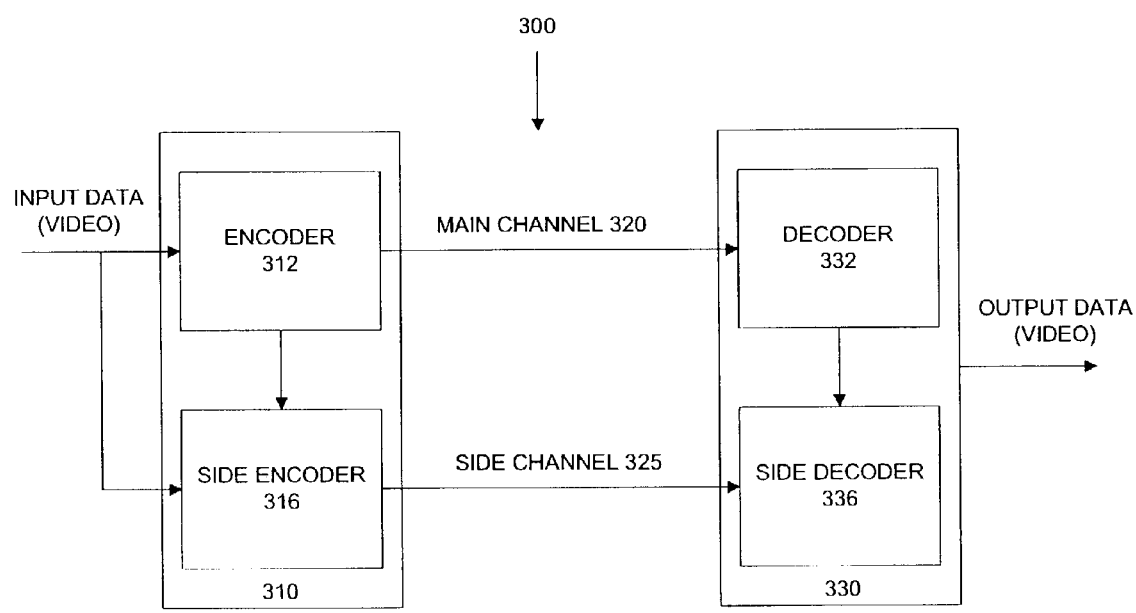
FIG. 3 is a block diagram of an exemplary processing system in accordance with one embodiment of the invention.

Referring now to FIG. 3, an exemplary multimedia processing system 300 that uses side information coding approach is illustrated, in accordance with one embodiment of the invention. As shown in FIG. 3, the system 300 includes an encoding subsystem or encoding component 310 and a decoding subsystem or decoding component 330. In one embodiment, the encoding subsystem 310 includes an encoder 312 which operates in accordance with an established standard such as the MPEG-4 standard or H.263 standard. The encoder 312 is also referred to as a conventional encoder herein. The encoding subsystem 310 further includes another encoder 316 (also called side-information encoder or hint-information encoder herein) that is coupled to the video encoder 312. The encoder 312 receives and encodes input data (e.g., video data) to generate encoded data that are transmitted to the decoding subsystem 330 via a main channel 320. The main channel 320 can be a wireless or a wired channel. The encoder 316 is coupled to receive input data and a reconstruction of the input data from the encoder 312 and generates encoded side or hint information that is transmitted to the decoding subsystem 330 via a separate channel 325 which can be a wireless or a wired channel. The channel 325 is also referred to as side channel or hint channel herein. In one embodiment, the difference between the input data and the reconstruction of the input data is referred to as residual data which may include prediction error information generated by the encoder 312. The structure and operations of the encoder 316 are described in greater detail below.

In one embodiment, as shown in FIG. 3, the decoding subsystem 330 includes a decoder 332 which operates in accordance with an established standard such as the MPEG-4 standard or the H.263 standard. The decoder 332 is also referred to as a conventional decoder herein. The decoding subsystem 330 further includes a decoder 336 for decoding side information received over the side channel 325. The information or data generated by the decoder 332 and decoder 336 are combined to generate the output data (e.g., output video data). The structure and operations of the decoding subsystem 330 and the decoder 316 are described in more details below.

Figure 4:
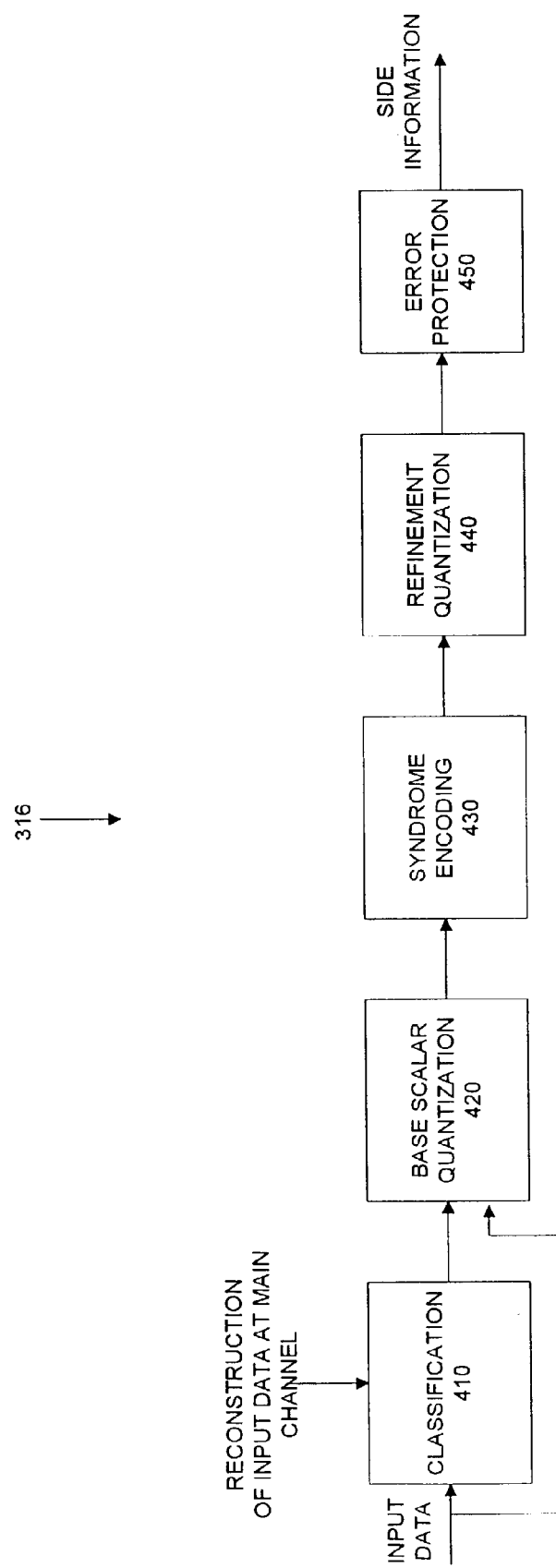
FIG. 4 is a block diagram of a side-information encoder in accordance with one embodiment of the invention.

FIG. 4 illustrates a detailed block diagram of the encoder 316 that is shown in FIG. 3 above, according to one embodiment of the invention. As shown in FIG. 4, the encoder 316 (also referred to as side-information encoder or simply side encoder herein) includes a classification unit 410, a base scalar quantization unit 420, a syndrome encoding unit 430, a refinement quantization unit 440, and an error detection/protection unit 450. These various units or components of the encoder 316 are described in more details below. It should be noted that the configuration or structure of the encoder 316 that is shown in FIG. 4 is just one embodiment or one implementation in accordance with the teachings of the present invention. Other configurations, structures, or variations can be implemented based on various applications of the invention and/or various system environments. For example, the classification and syndrome code choice can be matched to the instantaneous channel condition.

It should be noted that, depending on the allowed transmission rate on the side (hint) channel 325, some of the functions or processes performed by the encoder 316 can be modified or skipped. For example, the Base Scalar Quantization can be modified depending on the statistics of N and the available bit rate for side information. Similarly, the refinement quantization process or function may be modified or skipped. For purposes of explanations and illustrations, let X denote the current block to be encoded, Y be a reconstruction of the current block at the main channel and let Y=X+N, where N represents the difference between X and Y and may correspond to, for example, prediction error in the encoding of X, noise, and/or distortion introduced in the encoding and transmitting process, etc.

In the following discussion, it is assumed that the video frame to be encoded is divided into non-overlapping spatial blocks of pixels (e.g., 16×16, 8×8 etc.). It should be appreciated and understood by one skilled in the art that the teachings of the present invention are not limited to any particular division or partition of video frames to be encoded. The encoding process is described in details below, which can proceed block by block.

Classification:

In one embodiment, the classification unit 410 performs the classification function or process as follows. In order to match the channel code to the block, blocks are classified based on their correlation with the main channel reconstruction of the current frame. The statistics of N corresponding to the particular class are then used to determine or dictate the appropriate partitioning strategy. In one embodiment, energy in the block frame differences (e.g., a simple mean squared error difference between the current block and a reconstructed block on the main channel in the same location) can be used as a cue to classify the current block. A number of coding modes or classes can be used with each corresponding to a different degree of correlation. For example, at one extreme is a mode called the SKIP mode, where the correlation is so strong that the block is not encoded at all. At the other extreme is a mode called the INTRA mode, where the correlation is so weak that intra-coding is appropriate. Accordingly, there can be different syndrome coding modes in between these two extremes.

Figure 5:
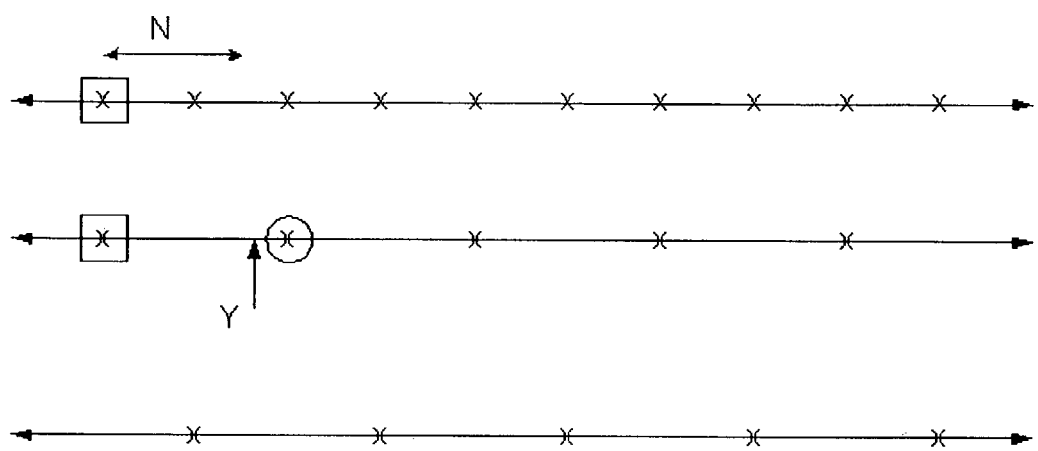
FIG. 5 is a diagram illustrating a quantized codeword set and the partitions of the quantized codeword space.

Base Scalar Quantization:

As shown in FIG. 4, the encoder unit 316 includes a base scalar quantization unit 420 to perform quantization on the pixel values. In one embodiment, the input data (e.g., pixel values) need to be quantized before encoding. For quantization, the choice of the step size can be limited by the statistics of N. For example, if a very fine step size is chosen to encode X, then there can be decoding errors, since the codewords may be too "close" to each other that the reconstructed information Y may not disambiguate them correctly. This is illustrated in a diagram shown in FIG. 5. As shown in FIG. 5, the top line shows the quantized codeword set for X, and the two bottom lines show the two partitions of the space of quantized codewords for X. The rectangular box shows the observed codeword which lies in the first partition. In this example, since the magnitude of N is more than the quantization step size, the decoder uses the reconstructed information Y to decode the incorrect (circled) codeword. Thus, each of the elements of X is quantized with a step size proportional to the standard deviation of the corresponding element in N.

Syndrome Encoding:

Referring again to FIG. 4, the syndrome coding unit 430 performs syndrome encoding with respect to the data generated from base scalar quantization unit 420. In this embodiment, the space of quantized codewords which has been appropriately generated using the statistics of N can be partitioned using a channel code with good distance properties (e.g., Euclidean space trellis channel codes, turbo codes, Low Density Parity Check (LDPC) codes, or other channel codes that are known in the art, etc.). This is analogous to the repetition channel code that was used to partition the source codeword space discussed above.

Figure 6:
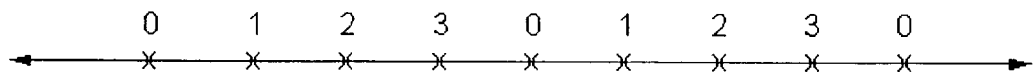
FIG. 6 is a diagram illustrating a Mod-4 labeling of the space of quantized codewords.

In one embodiment, a rate-½ trellis code could be used for this purpose. A rate-½ trellis code of block length N is a subspace of $\{0, 1, 2, 3\}N$ (e.g., the repetition channel code of block length 3 ([0 0 0] and [1 1 1]) is a subspace of $\{0, 1\}3$). Hence, it can be used to partition the space $\{0, 1, 2, 3\}N$. For this reason, the space of quantized codewords needs to be converted to $\{0, 1, 2, 3\}N$. In one embodiment, this can be done by using a mod-4 labeling of the quantization lattice, as shown in FIG. 6.

In one embodiment, the transmission or the coset index rate incurred in this case is 1 bit/sample. In this example, a rate-½ trellis code of block length N which is a subspace of $\{0, 1, 2, 3\}N$ has 2 N codewords in the space of size 4N. Hence there are 4 N/2 N=2 N cosets associated with it, which can be indexed by N bits, thus corresponding to a rate of 1 bit/sample.

The generation of the coset index (syndrome) associated with each codeword can be accomplished in a computationally efficient manner through a simple convolution operation (linear in the number of coefficients) between the quantized codeword and the parity check matrix of the trellis code.

Refinement Quantization:

As shown in FIG. 4, the data generated by the syndrome encoding unit 430 can be further refined by the refinement quantization unit 440. In general, a target reconstruction quality corresponds to a particular quantization step size. (e.g., higher desired quality corresponds to a finer quantization step size and lower quality corresponds to a coarser quantization step size). Quality is typically measured in PSNR (Peak Signal-to-Noise Ratio) (dB), with PSNR=log 10 (255²/MSE), where MSE denotes mean squared error between the original block and the encoded block divided by the number of pixels in the block.

For the pixel values that are syndrome encoded, the choice of the base quantization step size is limited by N. This is done so as to minimize the probability of decoding error. Hence, assuming that the base quantization interval can be conveyed correctly with high fidelity to the decoder, it can be refined further to the target quantization step size. In one embodiment, the refinement operation could be as simple as just a progressive sub-dividing of the base quantization interval into intervals of size equal to the target quantization step size. In this case, the index of the refinement interval inside the base interval is transmitted to the decoder.

It should be understood by one skilled in the art that performing syndrome coding and refinement quantization is but one way of implementing and realizing the gains of coding with side information. As mentioned above, other configurations, variations, or combinations of the various processing stages described herein can be implemented depending on the various applications of the present invention. For example, the refinement quantization stage or process may be omitted or skipped if it is not needed in certain applications or certain system environments.

It should be noted here that the base quantization and the refinement quantization levels can be adjusted or adapted based on various factors to maintain a proper balance between quality and efficiency. These various factors may include, but are not limited to, available bit rate for the side information, the channel conditions and the amount of protection the side channel has to provide to achieve a desired level of quality, etc.

Decoding Error Detection/Protection:

As illustrated in FIG. 4, the encoder 316 may include an error detection/protection unit 450. It should be noted that at the encoder subsystem, side information encoding is done in principle with respect to the statistics of error between the block X that is to be encoded and the "best" predictor Y for this block in the main channel frame memory. Since the encoding process is statistical, there can be decoding errors which need to be detected. This could be accomplished by error protection code such as cyclic redundancy check (CRC) code. In this embodiment, the encoder 316 thus transmits not only the syndrome for the side information encoded coefficients but also a CRC check of sufficient strength of the quantized sequence of codewords. This CRC check can serve as a "signature" of the quantized codeword sequence. In contrast to the conventional encoding/decoding paradigm, it is the decoder's task to do motion search in the new approach discussed herein. In one embodiment, the decoder searches over the space of candidate predictors one-by-one to decode a sequence from the set labeled by the syndrome. When the decoded sequence matches the CRC check, decoding is declared to be successful. It should be noted that the CRC needs to be sufficiently strong so as to act as a reliable signature for the codeword sequence.

Figure 7:
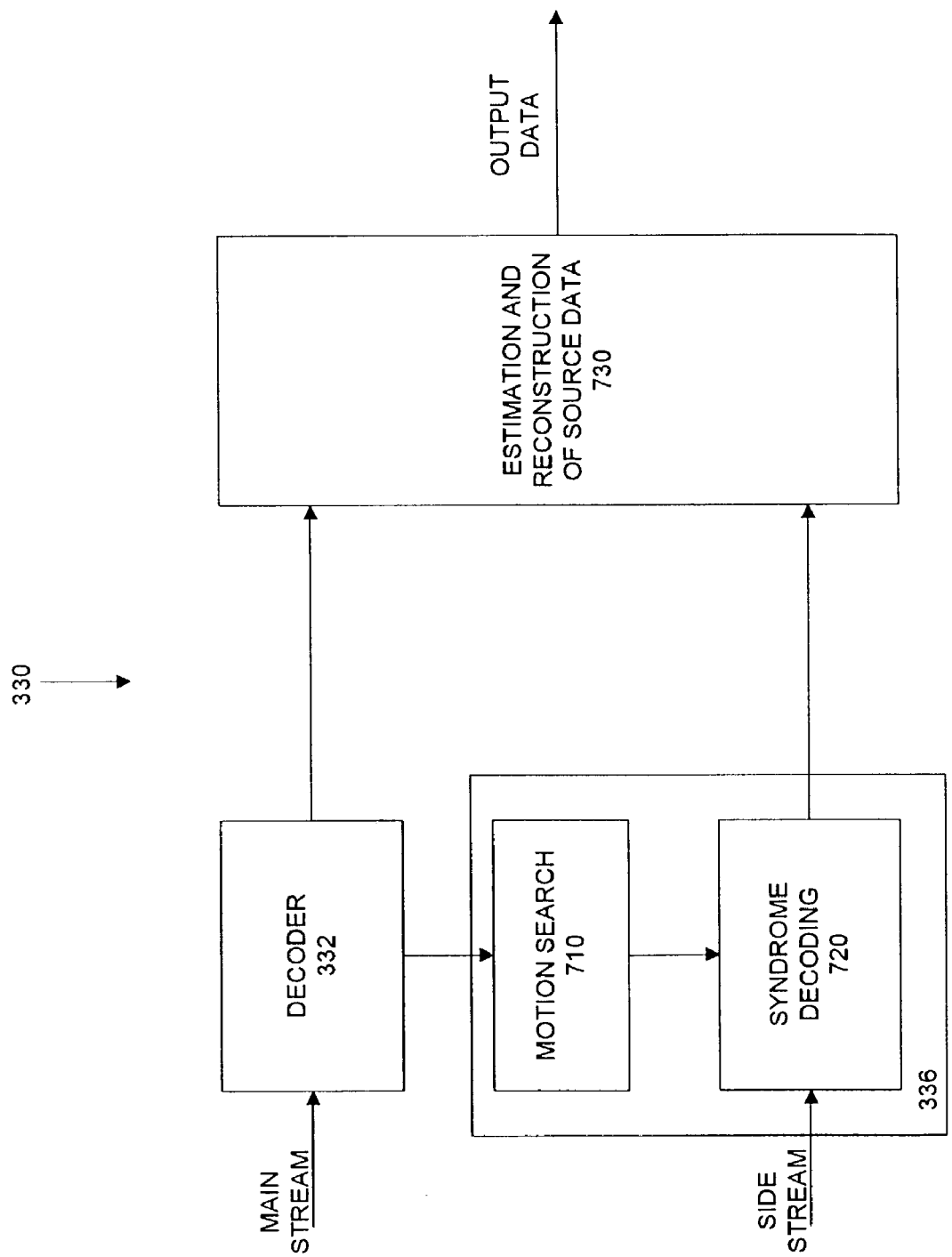
FIG. 7 is a block diagram of a decoding subsystem including a side-information decoder in accordance with one embodiment of the invention.

Referring now to FIG. 7, a more detailed block diagram of the decoding subsystem 330 is illustrated. As shown in FIG. 7, the decoding subsystem 330 may include the decoder unit 332, the decoder unit 336, and an estimation and reconstruction unit 730. In one embodiment, the decoder 336 (also called a side-information decoder or simply side decoder herein) may include a motion search unit 710 and a syndrome encoding unit 720. The operations and functions of the various units included in the decoding subsystem 330 are described in more details below.

Motion Search:

In one embodiment, the motion search unit 710 performs motion search to generate candidate predictors to decode the sequence of quantized codewords from the set indicated by the received syndrome. Exhaustive half pixel motion search can be used here to obtain various candidate predictors as is also done at the encoding side in standard video algorithms. It should be noted that the methods and system framework discussed herein can be applied to accommodate any other sophisticated motion estimation procedures such as multi-frame prediction, optical flow, control grid interpolation, etc.

In one embodiment, motion search is not performed when the main channel has no errors or when motion vectors are not corrupted. It should be noted here that motion search operations can be time consuming and computationally intensive. Therefore, if the motion vectors arrive without error in the main stream, motion search operations need not be performed.

Syndrome Decoding:

Continuing with present discussion, syndrome decoding is performed by the syndrome decoding unit 720. In one embodiment, each of the candidate predictors generated by the motion search unit 710 is used to decode a sequence of quantized codewords from the set indicated by the syndrome. For the case of trellis codes, this decoding can be accomplished using the Viterbi algorithm. Here the set of all sequences labeled by the received syndrome is represented on a trellis. The Viterbi algorithm can then be used to identify the sequence in this set that is "nearest" to the candidate predictor. For other codes (e.g., turbo codes), the corresponding decoding algorithms (e.g., iterative decoding) can be used. If this decoded sequence matches the CRC check, then the decoding is declared to be successful. Otherwise, using the motion search module, the next candidate predictor is obtained and then the procedure is repeated.

Estimation and Reconstruction:

Once the quantized codeword sequence is recovered by the syndrome decoding unit 720, the recovered codeword sequence is provided to the estimation and reconstruction unit 730 (also called combination unit herein). The recovered codeword sequence is used along with the predictor available from the main channel to obtain the best reconstruction of the source data. If X, Y and N are modeled as Gaussian random variables, the best linear estimate from the predictor and the quantized codeword could be used to obtain the source reconstruction. However, any of the sophisticated signal processing algorithms (e.g., spatio-temporal interpolation) or post processing mechanisms can be deployed in this framework and these may serve to improve the overall performance of the processing system.

In other words, as illustrated in FIG. 7, the reconstructed mainstream data and the reconstructed side stream data are combined by combination unit 730 to generate the output data (e.g., video output data). Various techniques can be used to combine the reconstructed mainstream data and the reconstructed side stream data to generate the output data. For example, a linear weighting (based on linear estimation) or any other nonlinear blending techniques known in the art can be used to combine the reconstructed mainstream data and the reconstructed side stream data.

Figure 8:
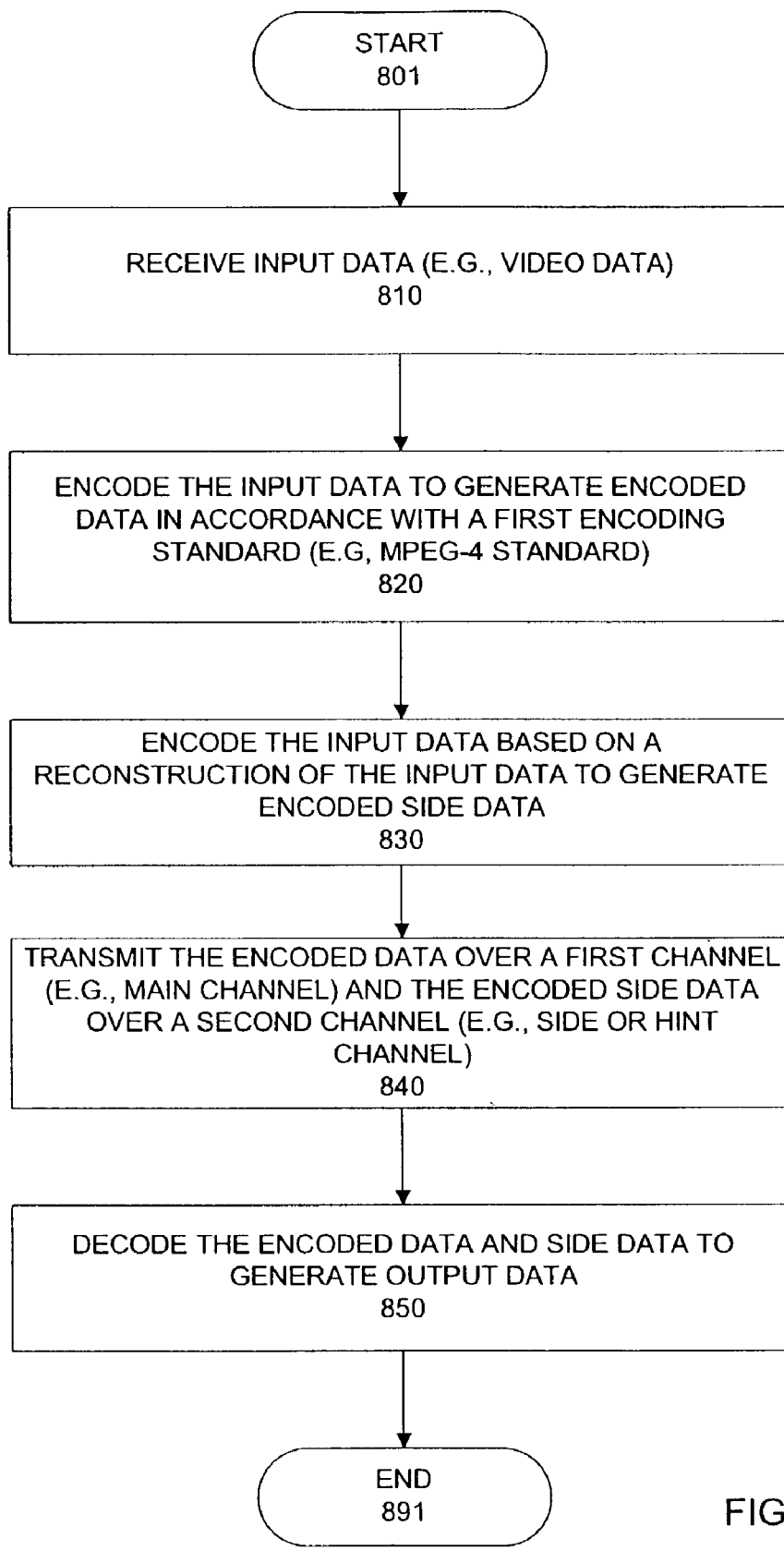
FIG. 8 is a flow diagram of a method in accordance with one embodiment of the invention.

FIG. 8 illustrates a flow diagram of a method for processing information (e.g., video data) in accordance with one embodiment of the present invention. At block 810, input data (e.g., input video data) is received. At block 820, the input video data is encoded according to an established standard (e.g., MPEG-4 or H.263 standard) to generated encoded data. At block 830, the input data is encoded based on a reconstruction of the input data to generate encoded side information (also called hint information). At block 840, the encoded data generated at block 820 is transmitted to a destination (e.g., a decoding subsystem) over a first channel (also called the main channel) and the encoded side information is transmitted to the destination (e.g., the decoding subsystem) over a second channel (also called the side channel or hint channel). As discussed herein, the information stream transmitted over the main channel is also called the main stream whereas the information stream transmitted over the side channel is also called the side stream. At block 850, upon receiving the encoded data from the main channel and the encoded side information from the side channel, the encoded data received and the side information received are decoded to generate output data (e.g., output video data).

As described above, it can be seen that the methods and system framework in accordance with various embodiments of the invention can be applied and implemented in various system configurations, applications, and various types of correlated data including video and audio data. It can be seen from the above description that in a processing system which employs side information encoding/decoding such as that illustrated in FIG. 3, the system performance and quality of the output data generated by the decoding subsystem is improved compared to that of a conventional system. In other words, the side information based hint channel method/solution as disclosed herein is superior compared with conventional FEC based error resilience methods/solutions in at least two regards: (1) The side-information based method/solution of the present invention incurs far lower latency than FEC-based solutions for the same performance curve because the hint channel is a joint-source-channel code that can operate efficiently at a macroblock level, as opposed to FEC solutions which need to operate at frame or GOP levels and thus incurring significantly increased latency; and (2) Even when there are no errors encountered on the main channel, the side-information based approach of the present invention can result in improved quality because of the blending of two information streams as described above whereas standard FEC-based solutions cannot improve quality in this case.

While the present invention has been described with reference to particular embodiments and specific examples, it should be understood and appreciated by one skilled in the art that these embodiments and examples are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A method performed by an encoding apparatus, the method comprising:

encoding, with a first encoder of the encoding apparatus, input data in accordance with an encoding standard to generate encoded input data;

encoding, with a second encoder of the encoding apparatus, the input data based on a reconstruction of the input data by performing a syndrome coding process to generate encoded side data comprising an index that identifies one of a plurality of codeword sets associated with the input data;
transmitting the encoded input data to a destination over a first channel; and
transmitting the encoded side data to the destination over a second channel.

2. The method of claim 1 wherein the encoding standard is a standard compatible with MPEG-4 standard.

3. The method of claim 1 wherein the encoding standard is a standard compatible with H.263 standard.

4. The method of claim 1 wherein the input data comprises video data.

5. The method of claim 4 wherein frames of the input data to be encoded are divided into non-overlapping spatial blocks of pixels.

6. The method of claim 1, wherein encoding the side data further comprises:
correlating blocks of the input data with corresponding blocks in the reconstruction of the encoded input data; and
classifying the blocks based on the correlation.

7. The method of claim 6 wherein classifying the blocks comprises classifying the blocks based on energy differences between the blocks and the corresponding reconstructed blocks in the same location.

8. The method of claim 6 wherein classifying the blocks comprises classifying the blocks into one or more classes, wherein each of the classes corresponds to a particular degree of correlation.

9. The method of claim 1 further comprising:
quantizing the input data to generate one or more quantized codewords for the input data, wherein the codeword sets comprise the quantized codewords; and
performing the syndrome coding process with respect to the one or more quantized codewords to generate the encoded side data.

10. The method of claim 9 wherein a quantizing parameter used to quantize the input data is determined based on statistics of residual data corresponding to a difference between the input data and the reconstruction of the encoded input data.

11. The method of claim 10 wherein the residual data comprises prediction error information generated from the encoding of the input data.

12. The method of claim 1 further comprising performing a refinement quantization process on the encoded side data.

13. The method of claim 1 further comprising:
adding an error protection code to the encoded side data.

14. A method performed by a decoding apparatus, the method comprising:
receiving, at the decoding apparatus via a first channel, encoded input data;
receiving, at the decoding apparatus via a second channel, encoded side data comprising an index, produced according to a syndrome coding process, that identifies one of a plurality of codeword sets associated with the encoded input data received via the first channel;
decoding, in the decoding apparatus, the encoded input data received via the first channel;
decoding, in the decoding apparatus, the encoded side data received via the second channel to obtain the index;
combining, in the decoding apparatus, the decoded data received via the first channel and the decoded side data received via the second channel to generate decoded video output data.

15. The method of claim 14 wherein decoding the encoded side data comprises:
performing, with the decoding apparatus, a motion search process when motion information of the encoded input data received via the first channel contain errors.

16. The method of claim 14 wherein decoding the encoded side data comprises:
performing a syndrome decoding process to recover quantized codewords of the codeword set corresponding to the index of the encoded side data received from the second channel.

17. An apparatus comprising:
a first encoder that encodes input data in accordance with a coding standard, and transmits the encoded input data to a destination over a first channel;
a second encoder that receives the input data and a reconstruction of the input data, encodes the input data based on the reconstruction of the input data by performing a syndrome coding process to generate encoded side date wherein the encoded side data comprises an index that identifies one of a plurality of codeword sets associated with the input data, and transmits the encoded side data to the destination over a second channel.

18. The apparatus of claim 17 wherein the coding standard is compatible with MPEG-4 standard.

19. The apparatus of claim 17, wherein the second encoder comprises a classification unit to classify blocks of the input data based on their correlation with corresponding blocks in the reconstruction of the input data.

20. The apparatus of claim 17 wherein the coding standard is compatible with H.263 standard.

21. The apparatus of claim 17 wherein the input data comprises video data.

22. The apparatus of claim 21 wherein frames of the input data to be encoded are divided into non-overlapping spatial blocks of pixels.

23. The apparatus of claim 19 wherein the classification unit classifies the blocks of the input data based on energy differences between the blocks and the corresponding reconstructed blocks in the same location in the reconstruction of the input data.

24. The apparatus of claim 19 wherein the classification unit classifies the blocks into one or more classes, and further wherein each of the classes corresponds to a particular degree of correlation.

25. The apparatus of claim 17 further comprising:
a quantization unit to quantize the input data to generate one or more quantized codewords for the input data, wherein the codeword sets comprise the quantized codewords; and
a syndrome coding unit to perform the syndrome coding process with respect to the quantized codewords to generate the encoded side data.

26. The apparatus of claim 25 wherein a quantizing parameter used to quantize the input data is determined based on statistics of residual data corresponding to a difference between the input data and the reconstruction of the encoded input data.

27. The apparatus of claim 26 wherein the residual data comprises prediction error information generated from the encoding of the input data.

28. The apparatus of claim 17 wherein the encoded side data is further refined through a refinement quantization process.

29. The apparatus of claim 17 further comprising:
an error protection unit to add an error protection code to the encoded side data.

30. A computer-readable medium encoded with a computer program which, when executed by at least one processor, causes the at least one processor to:
- encode, with a first encoder of an encoding apparatus, input data in accordance with a encoding standard to generate encoded input data;
- encode, with a second encoder of the encoding apparatus, the input data based on a reconstruction of the input data by performing a syndrome coding process to generate encoded side data comprising an index that identifies one of a plurality of codeword sets associated with the input data;
- transmit the encoded input data to a destination over a first channel; and
- transmit the encoded side data to the destination over a second channel.

31. The computer-readable medium of claim 30 wherein the computer program causes the at least one processor to:
- quantize the input data to generate one or more quantized codewords for the input data, wherein the codeword sets comprise the quantized codewords.

32. The computer-readable medium of claim 31 wherein the computer program cause the at least one processor to:
- perform the syndrome coding process with respect to the quantized codewords to generate the encoded side data.

33. The method of claim 1, further comprising maintaining the plurality of codeword sets, wherein each of the codeword sets comprises at least two codewords of a space of possible codewords, and further wherein performing the syndrome coding process comprises selecting the index that identifies the one of the plurality of codeword sets associated with the encoded input data.

34. The method of claim 33, further comprising generating the plurality of codeword sets based on the input data and a reconstruction of the encoded input data.

35. The method of claim 34, wherein generating the plurality of codeword sets comprises:
- determining a correlation between the input data and the reconstruction of the encoded input data; and
- generating the plurality of codeword sets based on at least the correlation between the input data and the reconstruction-of the encoded input data.

36. The method of claim 33, wherein selecting the index comprises selecting the index using a convolution operation between a quantized codeword for the input data and a parity check matrix of a channel code.

37. The method of claim 14, further comprising:
- maintaining the plurality of codeword sets, wherein each of the sets of the plurality of sets comprises at least two codewords of a space of possible codewords.

38. The apparatus of claim 17, wherein the second encoder maintains the plurality of codeword sets and wherein each of the sets comprises at least two codewords of a space of possible codewords.

39. The apparatus of claim 38, wherein the second encoder generates the plurality of codeword sets based on the input data and the reconstruction of the encoded input data.

40. The apparatus of claim 39, wherein the second encoder determines a difference between the input data and the reconstruction of the encoded input data and generates the plurality of codeword sets based on at least the difference between the input data and the reconstruction of the encoded input data.

41. The computer-readable medium of claim 30, wherein the computer program causes the at least one processor to:
- maintain, with the second encoder, the plurality of codeword sets, wherein each of the sets of the plurality of sets comprises at least two codewords of a space of possible codewords.

42. The computer-readable medium of claim 41, wherein the computer program causes the at least one processor to:
- determine, with the second encoder, a difference between the input data and the reconstruction of the encoded input data; and
- generate, with the second encoder, the plurality of codeword sets based on at least the difference between the input data and the reconstruction of the encoded input data.

* * * * *

UNITED STATES PATENT AND TRADEMARK OFFICE
CERTIFICATE OF CORRECTION

PATENT NO. : 7,643,558 B2  Page 1 of 1
APPLICATION NO. : 10/396982
DATED : January 5, 2010
INVENTOR(S) : Garudadri et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1088 days.

Signed and Sealed this

Eighteenth Day of January, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,643,558 B2 | Page 1 of 1 |
| APPLICATION NO. | : 10/396982 | |
| DATED | : January 5, 2010 | |
| INVENTOR(S) | : Garudadri et al. | |

It is certified that error appears in the above-identified patent and that said Letters Patent is hereby corrected as shown below:

Column 12, line 19, claim 17: "encoded side date" to read as --encoded side data--

Column 14, line 3, claim 35: "reconstruction-of the" to read as --reconstruction of the--

Column 14, line 13, claim 38: "codewords sets and wherein" to read as --codewords sets, and wherein--

Signed and Sealed this
Fourth Day of October, 2011

David J. Kappos
*Director of the United States Patent and Trademark Office*